United States Patent
Braithwaite et al.

(10) Patent No.: US 7,187,232 B2
(45) Date of Patent: Mar. 6, 2007

(54) FEED FORWARD AMPLIFIER EMPLOYING POSITIVE FEEDBACK PILOT GENERATION WITH AUTOMATIC LEVEL CONTROL

(75) Inventors: Richard Neil Braithwaite, Orange, CA (US); Matthew J. Hunton, Liberty Lake, WA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 11/369,529

(22) Filed: Mar. 7, 2006

(65) Prior Publication Data
US 2006/0176113 A1    Aug. 10, 2006

Related U.S. Application Data

(63) Continuation-in-part of application No. 10/838,985, filed on May 5, 2004, now Pat. No. 7,123,086.

(60) Provisional application No. 60/659,744, filed on Mar. 8, 2005, provisional application No. 60/468,444, filed on May 7, 2003.

(51) Int. Cl.
*H03F 3/66* (2006.01)

(52) U.S. Cl. ........................................ 330/52; 330/151
(58) Field of Classification Search ................. 330/52, 330/151, 149; 375/297; 455/114.3
See application file for complete search history.

(56) References Cited

U.S. PATENT DOCUMENTS

| 5,485,120 | A  | * | 1/1996 | Anvari ....................... 330/151 |
| 6,208,204 | B1 | * | 3/2001 | Suzuki et al. ................. 330/52 |
| 6,774,716 | B2 | * | 8/2004 | Suto ............................ 330/52 |

* cited by examiner

Primary Examiner—Henry Choe
(74) Attorney, Agent, or Firm—Myers Dawes Andras & Sherman LLP (57) ABSTRACT

A feed forward amplifier and method of amplification are disclosed. The amplifier output is used to generate a pilot signal via feedback using uncancelled noise in the amplifier output. An automatic level control circuit maintains the pilot signal at a substantially constant level when the detected uncancelled noise in the amplifier output is above a threshold level. The generated pilot signal strength is allowed to vary when the detected uncancelled noise in the amplifier output is below the threshold and disappears automatically when the amplifier is aligned.

20 Claims, 4 Drawing Sheets

FEED FORWARD AMPLIFIER EMPLOYING POSITIVE FEEDBACK PILOT GENERATION WITH AUTOMATIC LEVEL CONTROL

RELATED APPLICATION INFORMATION

The present application is a continuation-in-part of Ser. No. 10/838,985 filed May 5, 2004, now U.S. Pat. No. 7,123,086 which claims priority under 35 U.S.C. 119(e) to provisional application Ser. No. 60/468,444 filed May 7, 2003 and the present application also claims priority under 35 U.S.C. 119(e) to provisional application Ser. No. 60/659,744 filed Mar. 8, 2005, the disclosures of which are incorporated herein by reference in their entirety.

BACKGROUND OF THE INVENTION

1. Field of the Invention

The present invention relates to RF power amplifiers and amplification methods. More particularly, the present invention relates to feed forward power amplifiers and methods of using a pilot to align the loops of a feed forward amplifier.

2. Description of the Prior Art and Related Information

Figure 1:
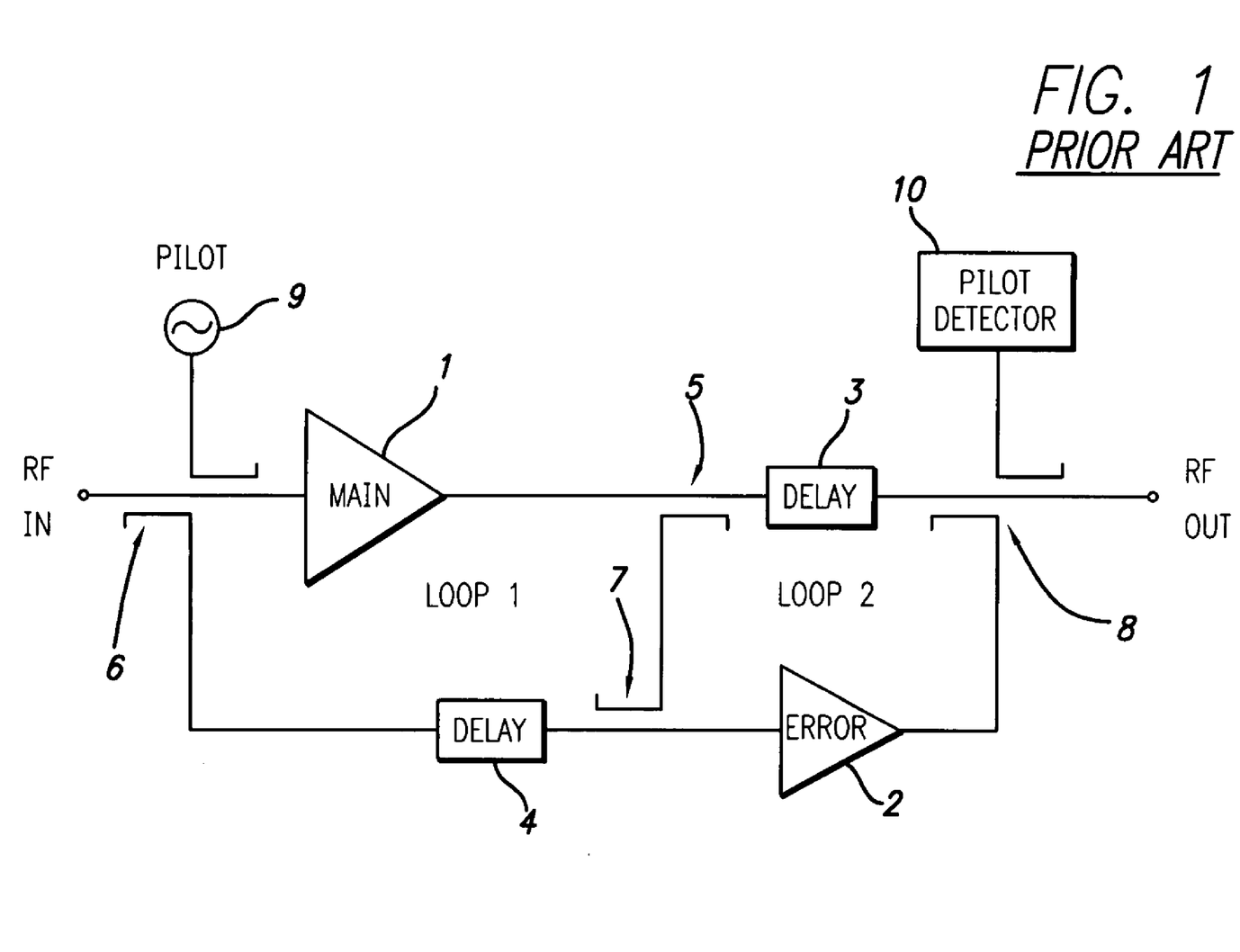
FIG. 1 is a block schematic drawing of a prior art feed forward amplifier.

A primary goal of RF power amplifier design is linearity over the range of power operation. Linearity is simply the ability to amplify without distortion. This requirement is critical for modern wireless communication systems but it is increasingly difficult to achieve. This is due primarily to the bandwidth requirements of modern wireless communication systems which are placing increasing demands on amplifier linearity. Feed forward compensation is a well known approach applied to amplifiers to improve linearity by estimating and canceling distortion. In feed forward RF power amplifiers an error amplifier is employed to amplify only distortion components which are then combined with the main amplifier output to cancel the main amplifier distortion component. FIG. 1 illustrates a conventional feed forward amplifier design having a main amplifier 1 and an error amplifier 2. The basic elements also include delays 3, 4 in the main and error path, respectively, and main to error path couplers 5, 6, 7 and 8. Additional elements not shown are also typically present in a conventional feed forward architecture as is well known to those skilled in the art. The delays, couplers and error amplifier are designed to extract distortion components from the main path and inject out of phase distortion components from the error path into the main amplifier output at coupler 8 to substantially eliminate the distortion component in the main amplifier path.

The performance of a feed forward amplifier may typically be analyzed based on two cancellation loops. Loop1, called the carrier cancellation loop, ideally provides a signal at the output of coupler 7 with the input RF carrier component cancelled and only a distortion component remaining. Loop 2 is referred to as the error cancellation loop or auxiliary path loop. In loop 2 the distortion component provided from coupler 7 is amplified by the error amplifier 2 and injected at coupler 8 to cancel the distortion component in the main path and ideally provide a distortion free signal at the output.

The quality of the distortion estimate (carrier cancellation) is determined by the alignment of the first loop in terms of gain and phase. The distortion cancellation in turn is determined by the alignment of the second loop in terms of gain and phase. In prior art systems, a pilot 9 is injected into the main amplifier path of the first loop, acting like a known distortion signal. The pilot signal is detected at the feed forward amplifier output by a pilot detector 10 and used to aid the alignment process for the second loop. When the second loop is aligned, the pilot is cancelled. If the second loop is misaligned, residual pilot power will be detected at the output of the feed forward amplifier. The degree of the misalignment is estimated from the measured power of the residual pilot. The alignment of the second loop is adjusted in an iterative manner with the goal of reducing the residual pilot power. The estimate of the pilot power must be reliable in order to determine if a given change in the gain and/or phase alignment represents an improvement.

Prior art pilot generation and detection systems must contend with various problems. First, there is a phase offset between the circuitry modulating and demodulating the pilot. As a result, it is necessary to compute the quadrature terms of the detected pilot in order to obtain a reliable estimate of the pilot power. Second, the pilot is 'always on' in order to measure the second loop alignment, even when the second loop is almost aligned fully. As a result, the residual pilot can appear at the output of the feed forward amplifier as a spectral spur. Third, the pilot power consumes part of the rated power handling capability of the main and error amplifiers. As a result, larger transistors are required to meet customer specifications, which in turn increases the cost.

In the prior art, the quadrature terms are obtained using two general approaches. The first approach generates a pilot tone without modulation and uses quadrature detection. The second approach modulates the pilot tone with quadrature components and uses scalar detection. In this approach the quadrature components are time-multiplexed to produce two independent measurements at the detector. The quadrature terms are then squared and added to obtain the pilot power. In general, the quadrature requirement adds expense and complexity to the pilot generation or detection circuitry, and adds complexity to the post-detector digital processing.

The residual pilot is considered to be an unwanted spectral emission from the feed forward amplifier. It must be limited when the amplifier is in an operational mode, after the second loop alignment has converged sufficiently to meet customer specifications. For prior art approaches, the amount of pilot power injected into the main amplifier path is therefore limited to prevent excessive residual spurs. This makes the detection circuitry more susceptible to noise, making the alignment process for the second loop less robust.

In the prior art, the pilot power consumes part of the power rating of the main and error amplifiers. In general, the power rating of the amplifier is determined primarily by linearity requirements rather than device failure. That is, the presence of the pilot power affects the amount of distortion produced rather than damaging the transistor. As a result, it would be desirable to reduce or turn off the pilot signal when the second loop is aligned fully or at least sufficiently to meet the spectral mask requirements. In addition to improving the power handling capability, turning off the pilot reduces the residual pilot spur appearing at the output. The problem with turning off the pilot is that subsequent misalignments in the second loop cannot be detected. This would make the amplifier very susceptible to thermally induced drift in the second loop gain or phase.

Accordingly, a need exists for a pilot generation and detection system which solves the above-mentioned problems in a simple, inexpensive, and effective manner.

SUMMARY OF THE INVENTION

In a first aspect the present invention provides a feed forward amplifier comprising an RF input for receiving an RF signal, a carrier cancellation loop, an error cancellation loop, and an RF output. The carrier cancellation loop comprises a main amplifier receiving and amplifying the RF signal, a main amplifier output sampling coupler, a first delay coupled to the RF input and providing a delayed RF signal, and a carrier cancellation combiner coupling the delayed RF signal to the sampled output from the main amplifier. The error cancellation loop comprises an error amplifier receiving and amplifying the output of the carrier cancellation combiner, a second delay coupled to the output of the main amplifier, and an error injection coupler combining the output from the error amplifier and the delayed main amplifier output from the second delay so as to cancel distortion introduced by the main amplifier. The RF output is coupled to the error injection coupler output and provides an amplified RF signal. The feed forward amplifier further comprises an output sampling coupler for providing a sampled output of the amplified RF signal and a positive feedback pilot generator circuit for generating a pilot signal from the sampled output of the amplified RF signal and providing the pilot signal to the input of the main amplifier, the pilot signal having a substantially constant strength when the uncancelled distortion from the error cancellation loop is above a threshold level. The positive feedback generator circuit also provides a detected pilot power signal from the sampled output of the amplified RF signal which varies with the strength of the uncancelled distortion from the error cancellation loop.

In a preferred embodiment the feed forward amplifier further comprises a controller and the threshold level is provided to the positive feedback pilot generator circuit from the controller and the positive feedback pilot generator circuit provides the detected pilot power signal to the controller. The feed forward amplifier preferably further comprises a phase adjuster and a gain adjuster coupled between the carrier cancellation combiner and the error amplifier, wherein the controller controls the gain adjuster and/or phase adjuster based on the detected pilot power signal. The feed forward amplifier also preferably comprises a phase adjuster and a gain adjuster coupled between the RF input and the main amplifier, wherein the controller controls the gain adjuster and/or phase adjuster based on the pilot power signal.

According to another aspect the present invention provides a pilot detection and generation system adapted for use with an RF amplifier having an RF input and an RF output. The pilot detection and generation system comprises a detector circuit for detecting a signal component representative of a band limited portion of the amplifier RF output and providing the signal component as an output, an automatic level control circuit coupled to the detector circuit and providing a level stabilized signal therefrom and a pilot generator circuit coupled to the automatic level control circuit for generating a pilot signal from the level stabilized signal output of the automatic level control circuit.

In a preferred embodiment of the pilot detection and generation system, the automatic level control circuit further comprises one or more outputs providing a variable signal representative of the signal power of the output of the detector circuit. The automatic level control circuit preferably also comprises a power detector and a feedback circuit for stabilizing the maximum level of the output of the detector circuit and providing it as the level stabilized signal, and a variable voltage attenuator configured in the feedback circuit for reducing the level of the signal from the detector circuit. The pilot detection and generation system preferably further comprises a local oscillator and the detector circuit comprises a first multiplier coupled to the local oscillator and mixing the local oscillator signal with the amplifier RF output and a bandpass filter coupled to the output of the first multiplier and providing as an output the signal component representative of a band limited portion of the amplifier RF output. The pilot generator circuit preferably further comprises a second multiplier coupled to the local oscillator for mixing the local oscillator signal with the level stabilized signal and providing as an output the pilot signal.

According to another aspect the present invention provides a method for generating a pilot signal from the output of an RF amplifier. The method comprises detecting a signal representative of a band limited sample of the amplifier output, performing an automatic level control operation on the signal to provide a level controlled signal and generating a pilot signal derived from the level controlled signal.

In a preferred embodiment of the method for generating pilot signal, detecting a signal representative of a band limited sample of the amplifier output comprises sampling an RF output signal from the amplifier, down converting the output signal to an intermediate frequency, and bandpass filtering the intermediate frequency signal. The down converting preferably comprises mixing the sampled RF output signal with a local oscillator signal. The method for generating a pilot signal also preferably comprises detecting the power of the band limited signal. Generating a pilot signal derived from the level controlled signal preferably further comprises mixing the level controlled signal with a local oscillator signal.

According to another aspect the present invention provides a method of controlling an amplifier. The method comprises sampling an output of the amplifier to provide a sampled signal, bandpass filtering the sampled signal to provide a band limited signal, deriving a level controlled signal from the band limited signal, generating a pilot signal derived from the level controlled signal, and injecting the pilot signal into a signal path of the amplifier. The method further comprises detecting any residual pilot signal in the band limited signal and controlling at least one of the gain and phase of a signal path in the amplifier in response to the detected pilot signal.

In a preferred embodiment of the method of controlling an amplifier, deriving a level controlled signal comprises performing a feedback level control on the band limited signal to limit the maximum power level of the signal.

According to another aspect the present invention provides a method for amplifying an RF input signal having an RF carrier with a carrier bandwidth. The method comprises receiving the RF input signal, amplifying the RF input signal employing a main amplifier, sampling the main amplifier output, delaying the RF input signal and providing a delayed RF input signal, and coupling the delayed RF input signal to the sampled output from the main amplifier so as to provide a distortion component of the sampled output from the main amplifier. The method further comprises amplifying the distortion component employing an error amplifier, delaying the output of the main amplifier, and combining the amplified distortion component and the delayed output of the main amplifier so as to cancel distortion introduced by the main amplifier and providing an amplified RF output. The method further comprises sampling the amplified RF output to provide a sampled output, band limiting the sampled output to a frequency band outside the RF carrier band, deriving a level controlled signal from the band limited signal, and generating a pilot signal from the band limited signal and injecting the pilot signal as an input to the main amplifier. The method further comprises detecting any residual pilot signal in the sampled output and controlling at least one of the gain or phase of the signal input to the error amplifier in response to the detected pilot signal.

In a preferred embodiment of the method for amplifying an RF input signal, deriving a level controlled signal comprises performing a feedback level control on the band limited signal to limit the maximum power level of the signal. Controlling the gain or phase of the signal input to the error amplifier preferably comprises adjusting at least one of the gain or phase so as to reduce the level of the generated pilot signal.

Further features and aspects of the invention are set out in the following detailed description of the invention.

DETAILED DESCRIPTION OF THE INVENTION

Figure 2:
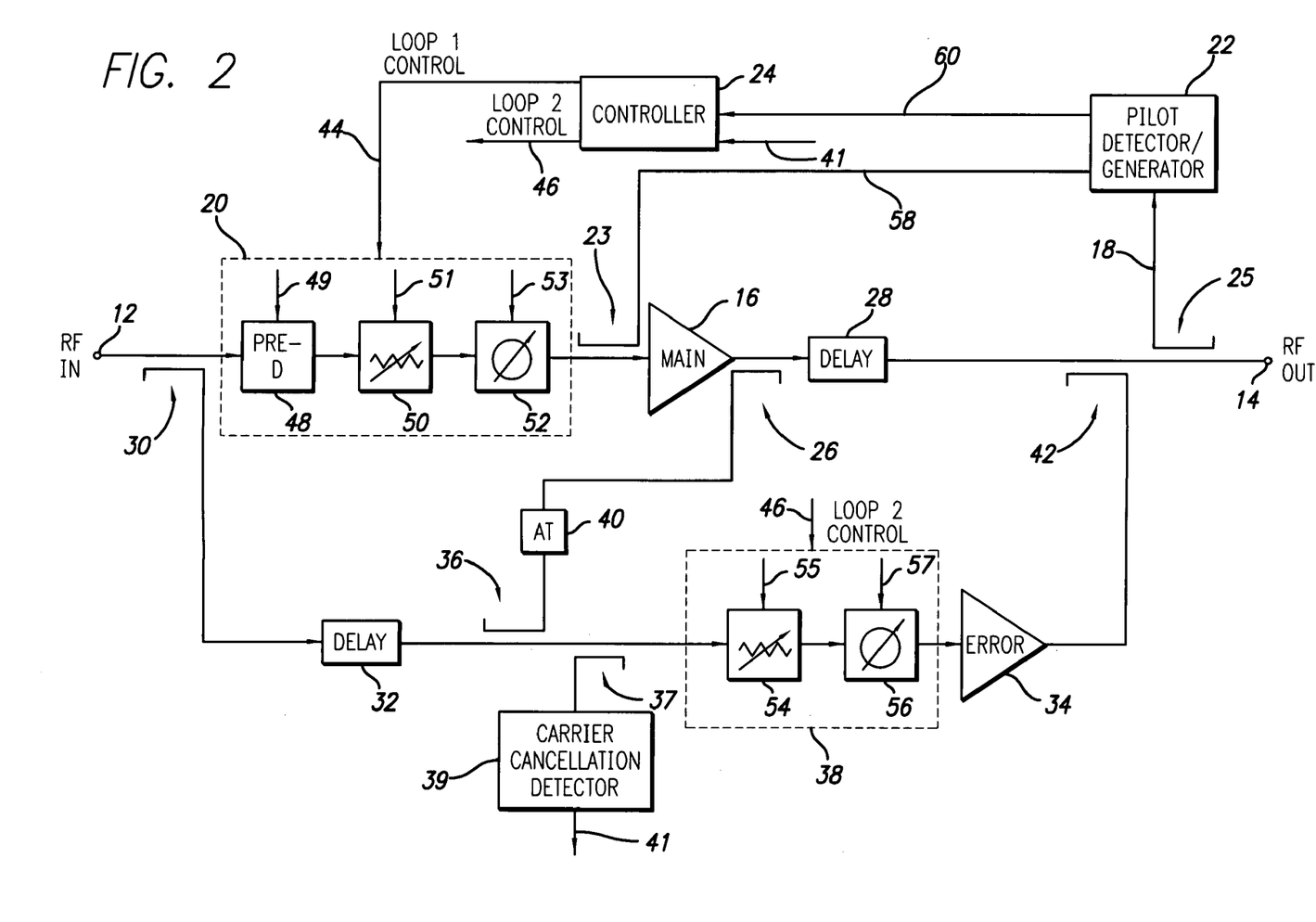
FIG. 2 is a block schematic drawing of a feed forward amplifier employing a positive feedback pilot generation system in accordance with the present invention.
Figure 3:
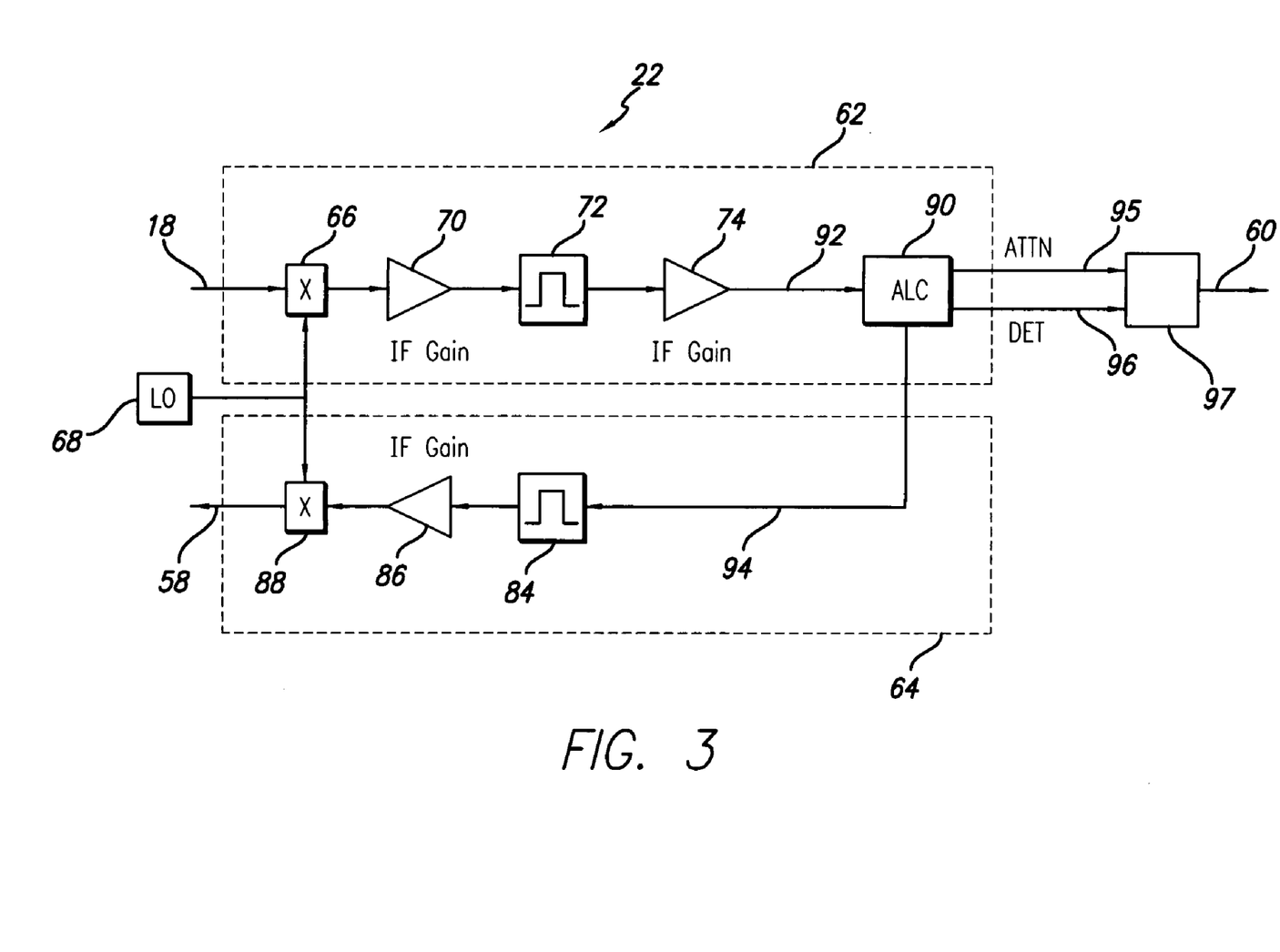
FIG. 3 is a block schematic drawing of a positive feedback pilot generation system employed in the feed forward amplifier of FIG. 2.

A feed forward amplifier in accordance with a preferred embodiment of the present invention is shown in FIG. 2 in a block schematic drawing. The feed forward amplifier employs a positive feedback pilot generation system, a preferred embodiment of which is shown in FIG. 3. The feed forward amplifier of the present invention may incorporate known features other than the novel aspects described in detail herein and such known features will not be described in detail. For example, additional features of a feed forward amplifier architecture and control system are described in U.S. patent application Ser. No. 10/365,111 filed Feb. 12, 2003, the disclosure of which is incorporated herein by reference in its entirety.

Referring to FIG. 2, the feed forward amplifier includes an input 12 which receives an input RF signal to be amplified and an output 14 which outputs the amplified RF signal. The RF signal may be a high bandwidth signal such as a CDMA (Code Division Multiple Access) spread spectrum communication signal or WCDMA (Wide Code Division Multiple Access) signal or other RF signal. The input RF signal is split into a main amplifier signal path and an error amplifier signal path at input coupler 30 in accordance with well known feed forward amplifier design. The main amplifier signal path includes main amplifier 16. The main amplifier signal path further includes input and pre-distortion circuitry 20. The input circuitry may include conventional preamplifier and group delay circuitry (not shown), and gain and phase control circuitry 50, 52, respectively, implemented in accordance with conventional feed forward design. The pre-distortion circuitry 48 in turn pre-distorts the input signal to reduce IMDs introduced by main amplifier 16 and may be optional in some implementations. Input and predistortion circuitry 20 is controlled by loop 1 control signals 44 provided from controller 24. In particular, these control signals include predistortion control signals 49, gain adjuster settings 51 and phase adjuster settings 53.

A positive feedback pilot generation circuit 22 (described in detail in relation to FIG. 3 below) provides a pilot signal 58 which is injected into the main amplifier input at pilot injection coupler 23 as illustrated and is used to control loop 2 alignment (as described below). The pilot signal is extracted at the amplifier output by pilot sampling coupler 25 and detected by circuit 22 and the detected pilot signal 60 is used by controller 24 to provide the loop control to minimize the pilot signal in the output signal and thereby minimize distortion in the output signal (as described in more detail below). Controller 24 may also provide a set point signal to circuit 22 (as described below in relation to FIG. 4). The main amplifier signal path further includes a main amplifier output sampling coupler 26 and delay 28, generally in accordance with conventional feed forward design.

Still referring to FIG. 2, the error amplifier signal path includes input signal coupler 30 which samples the RF input signal and provides it to the error amplifier 34 via delay 32, carrier cancellation combiner 36 and pre-error input circuitry 38. More specifically, delay 32 and carrier cancellation combiner 36 operate as in a conventional feed forward amplifier such that the sampled output of the main amplifier 16 is attenuated by attenuator 40 and combined with the delayed input signal at carrier cancellation combiner 36 to substantially cancel all but the distortion component of the sampled signal from the main signal path. This carrier cancellation completes loop 1 of the feed forward amplifier. The output of carrier cancellation combiner 36 is sampled by coupler 37 and the sampled signal is provided to carrier cancellation detector 39. The detected carrier cancelled signal 41 is provided to controller 24 which uses the detected signal to control the loop 1 gain and phase adjuster settings 51, 53 to minimize the detected carrier. In some applications and implementations it may be advantageous to control the loop 1 cancellation at combiner 36 to retain some RF carrier component in the resulting signal and the resulting signal is not purely the distortion component of the main amplifier. Nonetheless, for the purposes of the present application the resulting signal will be referred to as the distortion component and it should be understood some carrier component may be included. This distortion component of the signal is provided to pre-error input circuitry 38. Pre-error input circuitry 38 may include conventional preamplifier and group delay circuitry (not shown), and gain and phase control circuitry 54, 56. Controller 24 provides loop 2 control signals 46, comprising gain adjuster settings 55 and phase adjuster settings 57, to minimize the detected pilot from pilot detector 22. Unlike the main path a predistortion circuit is typically not required in the error path due to the more linear nature of the error amplifier operation. The output of circuitry 38 is provided to error amplifier 34 which restores the magnitude of the sampled distortion components (IMDs) to that in the main signal path. The amplified distortion component output from error amplifier 34 is combined out of phase with the delayed main amplifier output at error injection coupler 42 to cancel the distortion component in the main signal path. This error cancellation completes loop 2 of the amplifier. A substantially distortion free amplified signal is then provided to the output 14.

A sample of the output signal 18 is provided by coupler 25 to pilot detector and generator circuit 22. Any residual pilot signal in the output is detected by the pilot detector circuitry 22 and provided as a pilot power signal 60. The pilot power 60 is used by the controller 24, along with the carrier cancelled signal 41, to provide control signals 44 and 46. The two controls 44, 46 may be essentially independent and may be viewed as separate control of the two loops; loop1 comprising circuitry 20, main amplifier 16, main amplifier output sampling coupler 26, attenuator 40, input signal coupler 30, group delay 32 and carrier cancellation combiner 36; and loop 2 comprising main amplifier sampling coupler 26, attenuator 40, carrier cancellation combiner 36, pre-error circuit 38, error amplifier 34, delay 28 and error injection coupler 42. Loop 1 control by controller 24 employs signal 41 to adjust gain and phase adjusters 50, 52 to minimize the detected carrier 41 at the output of Loop 1. Loop 2 control by controller 24 employs the detected pilot power 60 to adjust the gain and phase adjusters 54, 56 to minimize the detected pilot power 60. Suitable loop control algorithms are known to those skilled in the art and may be implemented by controller 24 which may be a suitable programmed microprocessor. Additional feed forward Loop 1 and Loop 2 control algorithms are also described in U.S. patent application Ser. No. 10/733,087 filed Dec. 11, 2003 and Ser. No. 10/733,498 filed Dec. 11, 2003, the disclosures of which are incorporated herein by reference.

Referring to FIG. 3, a preferred embodiment of the positive feedback pilot generator 22 is illustrated in a block schematic drawing. As shown the circuit comprises a detection signal path 62 and a pilot generation signal path 64. The sampled RF output 18 of the feed forward amplifier is the input to the detection path 62. (An alternative approach is to measure the output of a dynamic range extender (DRE), which provides the feed forward amplifier output with some carrier cancellation. Such a dynamic range extender is described in U.S. Pat. No. 6,147,555 issued Nov. 14, 2000, e.g., in FIGS. 14 and 15 thereof, the disclosure of which is incorporated herein by reference.) The detection portion 62 of the system preferably comprises a bandpass power detector circuit, which detects uncancelled power in a relatively narrow bandwidth portion of the sampled amplifier output 18 at a frequency outside of the RF carrier bandwidth. The bandpass power detector circuit preferably comprises a mixer 66, bandpass filter 72, and an automatic level control (ALC) 90. IF gain stages 70, 74 may also be employed, depending on the signal strength of the sampled output 18. The RF input 18 to the detection path is down-converted to an IF frequency by Local Oscillator (LO) 68 and mixer 66. The IF signal is then bandpass filtered by filter 72 to provide a relatively narrow bandwidth signal including the pilot signal frequency. The power of this bandpass limited signal 92 is then detected by combining an attenuation signal (ATTN) 95 and a detector signal (DET) 96 from ALC 90 using a combining network 97 to form detected power output 60. The output 60 corresponds to the residual pilot power after the second loop cancellation. This pilot power output 60 is provided to the feed forward loop controller 24 (FIG. 2).

In an alternative embodiment the attenuation signal (ATTN) 95 may be used directly as a measure of the detected pilot signal strength and provided to controller 24. In such an embodiment combining network 97 may be dispensed with. In another alternate embodiment the power of the band pass limited signal 92 may be detected by a separate power detector and provided to the controller 24. In such an embodiment output lines 95 and 96 from ALC 90 may be dispensed with as well as combining network 97.

Still referring to FIG. 3, the pilot generation circuitry 64 is preferably the reverse line-up of the bandpass power detector circuit. The pilot generation circuit 64 preferably comprises bandpass filter 84, mixer 88, and IF gain stage 86. Additional or fewer IF gain stages may be employed, depending on signal strength. The pilot generation circuit 64 uses the bandpass filtered IF signal 94 from the ALC 90 as an input. The signal 94 is bandpass filtered by filter 84 (if spurious rejection from the ALC circuit is necessary) then up-converted to RF by mixer 88 and LO 68, after a second IF gain stage 86 (if necessary).

Figure 4:
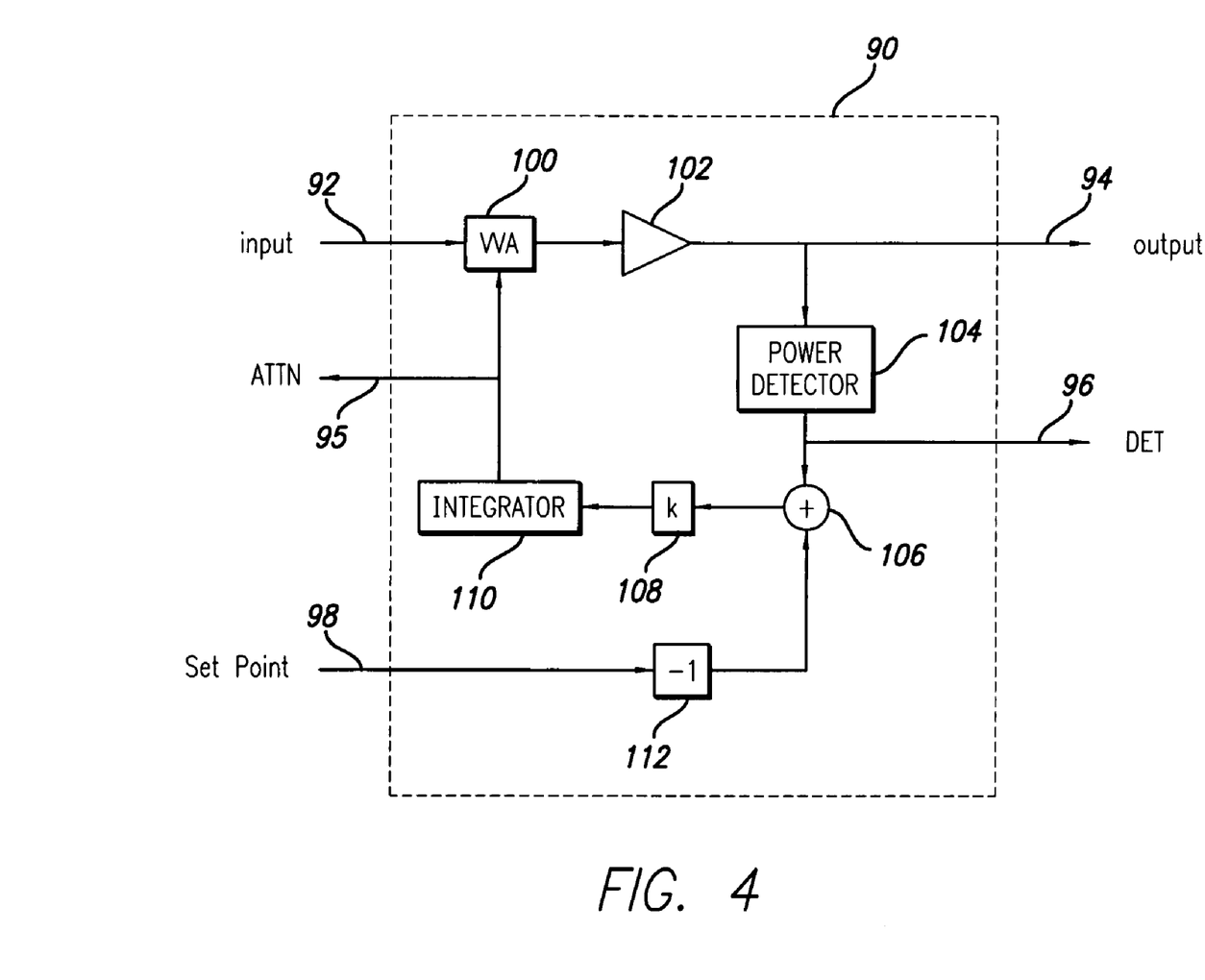
FIG. 4 is a block schematic drawing of a preferred embodiment of the ALC circuit of FIG. 3.

The above-mentioned ALC 90 controls the amplitude level of the generated pilot. One possible implementation of an ALC is shown in FIG. 4. The ALC 90 regulates the amplitude at its output 94 by adjusting the attenuation in the signal path from input 92 to output 94. The signal path comprises a variable attenuator (WA) 100 and a gain stage 102. A power detector 104 is connected to the output 94. A control feedback loop adjusts the WA 100 in an attempt to keep the detected power DET 96 constant. The feedback path comprises a summer 106, loop gain k 108, and an integrator 110. The input to the feedback loop is the detected power DET 96 and the output is ATTN 95. The integrator 110 is typically clamped to prevent the ATTN 95 from exceeding the control voltage range of the WA 100. The integrator can be replaced with a low pass filter.

It is important to distinguish between the detected residual pilot and the generated pilot. The signal DET 96 measures the latter. The detected residual pilot 60, measuring the uncancelled pilot at the output 14 of the feed forward system, is a combination of ATTN 95 and DET 96. When both ATTN 95 and DET 96 are logarithmic, the combining network 97 performs an addition to form signal 60. Even if ATTN 95 and DET 96 are not logarithmic, a summing operation is sufficient because the signal 60 will be monotonic with the detected residual pilot.

In a typical operation, DET 96 will be constant, at a level determined by the set point 98 which may be provided from loop controller 24 (FIG. 2). The set point 98 is made negative using 112 then added to DET 96. When DET 96 is lower (higher) than the set point 98 the attenuation 100 is decreased (increased). If the attenuation 100 reaches its minimum value, the signal DET 96 will decrease as the second loop alignment improves further. This corresponds to the onset of the pilot turn off.

The same LO 68 frequency is preferably used for both the pilot detection down-conversion at mixer 66 and the pilot generation up-conversion at mixer 88. The frequency of LO 68 is chosen to place the pilot signal outside of the bandwidth of the RF carrier of the input signal to the feed forward amplifier and to facilitate detection of the signal in circuit 62. Also, a suitable choice of LO frequency may allow a relatively inexpensive IF filter 72 to be employed. For example, a LO frequency of about 85 MHz frequency shift from the carrier band will allow an inexpensive SAW filter to be used, e.g. with a 5 MHz pass band. Various other choices of LO frequency and filter passband are also possible, however.

In operation, the pilot detection and generation circuit 22 creates a narrow bandwidth, positive feedback loop through the main amplifier 16 and the second loop of the feed forward amplifier (FIG. 2). When combined with the ALC 90, a limit-cycle oscillation will develop using noise present in the feed forward amplifier and the pilot system, assuming that the loop has sufficient gain. The cancellation of the second loop affects the gain and phase of the positive feedback loop. As a result, good alignment of the second loop will suppress the limit-cycle oscillation. The degree of alignment required to suppress the limit cycle is selectable based on the amount of IF gain provided by the IF gain stages preceding the ALC 90 or by adjusting the set point 98 of ALC 90.

A number of modifications of the illustrated implementation of the positive feed back pilot generation circuit 22 are possible. For example, an implementation of the bandpass power detector circuit 62 may employ an RF filter which is placed before the mixer 66 to reject image frequencies. In such an approach, a similar RF filter is preferably included within the pilot generation path 64 after the mixer 88. Also, it is possible to eliminate the bandpass filter 84 within the pilot generation path 64 if ALC spurious emissions are low. Also, as noted above, the number of IF gain stages, the set point 98 of the ALC 90, the LO frequency and the filter passband bandwidth may all be varied in accordance with the particular implementation and the particular RF carrier being amplified.

From the foregoing it will be appreciated that the present invention provides a number of advantages over prior approaches. As discussed above, prior approaches to pilot generation and detection must contend with various problems. First, there is a phase offset between the circuitry modulating and demodulating the pilot. As a result, it is necessary to compute the quadrature terms of the detected pilot in order to obtain a reliable estimate of the pilot power. Second, the pilot is 'always on' in order to measure the second loop alignment, even when the second loop is almost aligned fully. As a result, the residual pilot can appear at the output of the feed forward amplifier as a spectral spur. Third, the pilot power consumes part of the rated power handling capability of the main and error amplifiers. As a result, larger transistors are required to meet customer specifications, which in turn increases the cost.

In accordance with the present invention a pilot generation and detection system is disclosed which is based on a bandpass power detector circuit and positive feedback. The operation of the positive feedback pilot generation has many advantages, solving the above-mentioned problems in a simple, inexpensive, and novel manner.

More specifically, with respect to the quadrature detection problem experienced by the prior art, the LO phase alignment is achieved automatically within the present system by adjusting the frequency of the pilot, exploiting the delay around the feedback loop. The frequency adjustment is a by-product of the positive feedback. That is, the maximum loop gain producing the desired phase alignment will be sought as a natural mode of the system. As a result, the pilot power is measured directly as a scalar value, not requiring additional digital signal processing to transform quadrature components into power. The bandpass filters in the detection and generation paths limit the range of frequencies that the pilot system will generate.

The pilot system of the present invention has an additional benefit: the pilot turns off when the alignment is complete and turns back on if the alignment degrades subsequently. The 'on and off' feature of the pilot system is a by-product of the positive feedback and the ALC within the generation path. When the misalignment of the second loop is large, the pilot will have nearly constant amplitude. This is due to the ALC placed in the generation path. The variations in the pilot amplitude will be due primarily to the bandpass filter placed after the ALC. As the alignment of the second loop improves, the detected pilot decreases. Once the detected value drops sufficiently low so that the ALC is at its minimum attenuation, the pilot power falls rapidly. As a result, the pilot will turn off because the second loop cancellation has reduced the loop gain so low that it cannot sustain the limit-cycle oscillation. However, if the second loop becomes misaligned, the pilot signal will return automatically. As a result of this "on and off" feature, a higher power pilot signal may be generated without negatively affecting amplifier performance. For example, a 10 dB stronger pilot signal than is conventionally used may be generated. This provides better pilot signal detection and more robust loop control.

In summary, the novel pilot signal generation system of the present invention is simple, inexpensive, robust, and better performance is obtained at lower costs.

A preferred embodiment of the present invention of an RF power amplifier design which provides an improved pilot tone generation technique has been described in relation to the various figures. Nonetheless, it will be appreciated by those skilled in the art that a variety of modifications and additional embodiments are possible within the teachings of the present invention. For example, a variety of specific pilot generation circuit implementations may be provided employing the teachings of the present invention and limitations of space prevent an exhaustive list of all the possible circuit implementations or an enumeration of all possible control implementations. A variety of other possible modifications and additional embodiments are also clearly possible and fall within the scope of the present invention. Accordingly, the described specific embodiments and implementations should not be viewed as in any sense limiting in nature and are merely illustrative of the present invention.

What is claimed is:

1. A feed forward amplifier, comprising:
   an RF input for receiving an RF signal;
   a carrier cancellation loop comprising a main amplifier receiving and amplifying said RF signal, a main amplifier output sampling coupler, a first delay coupled to the RF input and providing a delayed RF signal, and a carrier cancellation combiner coupling the delayed RF signal to the sampled output from the main amplifier;
   an error cancellation loop comprising an error amplifier receiving and amplifying the output of the carrier cancellation combiner, a second delay coupled to the output of the main amplifier, and an error injection coupler combining the output from the error amplifier and the delayed main amplifier output from the second delay so as to cancel distortion introduced by the main amplifier;
   an RF output coupled to the error injection coupler output and providing an amplified RF signal;
   an output sampling coupler for providing a sampled output of the amplified RF signal; and
   a positive feedback pilot generator circuit for generating a pilot signal from the sampled output of the amplified RF signal and providing the pilot signal to the input of the main amplifier, the pilot signal having a substantially constant strength when the uncancelled distortion from the error cancellation loop is above a threshold level, and for providing a detected pilot power signal from the sampled output of the amplified RF signal which varies with the strength of the uncancelled distortion from the error cancellation loop.

2. A feed forward amplifier as set out in claim 1, further comprising a controller and wherein said threshold level is provided to said positive feedback pilot generator circuit from said controller.

3. A feed forward amplifier as set out in claim 2, wherein said positive feedback pilot generator circuit provides said detected pilot power signal to said controller.

4. A feed forward amplifier as set out in claim 3, further comprising a phase adjuster and a gain adjuster coupled between the carrier cancellation combiner and the error amplifier, wherein said controller controls the gain adjuster and/or phase adjuster based on said detected pilot power signal.

5. A feed forward amplifier as set out in claim 3, further comprising a phase adjuster and a gain adjuster coupled between the RF input and the main amplifier, wherein said controller controls the gain adjuster and/or phase adjuster based on said pilot power signal.

6. A pilot detection and generation system adapted for use with an RF amplifier having an RF input and an RF output, comprising:
 a detector circuit for detecting a signal component representative of a band limited portion of the amplifier RF output and providing the signal component as an output;
 an automatic level control circuit coupled to the detector circuit and providing a level stabilized signal therefrom; and
 a pilot generator circuit coupled to said automatic level control circuit for generating a pilot signal from the level stabilized signal output of the automatic level control circuit.

7. A pilot detection and generation system as set out in claim 6, wherein said automatic level control circuit further comprises one or more outputs providing a variable signal representative of the signal power of the output of the detector circuit.

8. A pilot detection and generation system as set out in claim 6, wherein said automatic level control circuit comprises a power detector and a feedback circuit for stabilizing the maximum level of the output of the detector circuit and providing it as said level stabilized signal.

9. A pilot detection and generation system as set out in claim 8, wherein said automatic level control circuit further comprises a variable voltage attenuator configured in said feedback circuit for reducing the level of the signal from said detector circuit.

10. A pilot detection and generation system as set out in claim 6, further comprising a local oscillator, wherein said detector circuit comprises a first multiplier coupled to said local oscillator and mixing the local oscillator signal with the amplifier RF output and a bandpass filter coupled to the output of said first multiplier and providing as an output said signal component representative of a band limited portion of the amplifier RF output, and wherein said pilot generator circuit further comprises a second multiplier coupled to said local oscillator and mixing the local oscillator signal with said level stabilized signal and providing as an output said pilot signal.

11. A method for generating a pilot signal from the output of an RF amplifier, comprising:
 detecting a signal representative of a band limited sample of the amplifier output;
 performing an automatic level control operation on said signal to provide a level controlled signal; and
 generating a pilot signal derived from said level controlled signal.

12. A method for generating a pilot signal as set out in claim 11, wherein said detecting a signal comprises sampling an RF output signal from said amplifier, down converting the output signal to an intermediate frequency, and bandpass filtering the intermediate frequency signal.

13. A method for generating a pilot signal as set out in claim 12, wherein said down converting comprises mixing the sampled RF output signal with a local oscillator signal.

14. A method for generating a pilot signal as set out in claim 11, further comprising detecting the power of the band limited signal.

15. A method for generating a pilot signal as set out in claim 11, wherein said generating a pilot signal further comprises mixing the level controlled signal with a local oscillator signal.

16. A method of controlling an amplifier, comprising:
 sampling an output of the amplifier to provide a sampled signal;
 bandpass filtering said sampled signal to provide a band limited signal;
 deriving a level controlled signal from the band limited signal;
 generating a pilot signal derived from the level controlled signal;
 injecting said pilot signal into a signal path of the amplifier;
 detecting any residual pilot signal in said band limited signal; and
 controlling at least one of the gain and phase of a signal path in the amplifier in response to said detected pilot signal.

17. A method of controlling an amplifier set out in claim 16, wherein deriving a level controlled signal comprises performing a feedback level control on the band limited signal to limit the maximum power level of the signal.

18. A method for amplifying an RF input signal having an RF carrier with a carrier bandwidth, comprising:
 receiving an RF input signal;
 amplifying said RF input signal employing a main amplifier;
 sampling the main amplifier output;
 delaying the RF input signal and providing a delayed RF input signal;
 coupling the delayed RF input signal to the sampled output from the main amplifier so as to provide a distortion component of said sampled output from the main amplifier;
 amplifying the distortion component employing an error amplifier;
 delaying the output of the main amplifier;
 combining the amplified distortion component and the delayed output of the main amplifier so as to cancel distortion introduced by the main amplifier and providing an amplified RF output;
 sampling the amplified RF output to provide a sampled output;
 band limiting the sampled output to a frequency band outside the RF carrier band;
 deriving a level controlled signal from the band limited signal;
 generating a pilot signal from the band limited signal and injecting the pilot signal as an input to the main amplifier;
 detecting any residual pilot signal in the sampled output; and
 controlling at least one of the gain or phase of the signal input to the error amplifier in response to the detected pilot signal.

19. A method for amplifying an RF input signal as set out in claim 18, wherein deriving a level controlled signal comprises performing a feedback level control on the band limited signal to limit the maximum power level of the signal.

20. A method for amplifying an RF input signal as in claim 18, wherein said controlling comprises adjusting at least one of the gain or phase so as to reduce the level of the generated pilot signal.

* * * * *